United States Patent
Lee

(10) Patent No.: US 11,341,403 B2
(45) Date of Patent: May 24, 2022

(54) SYNAPSE SYSTEM OF A NEUROMORPHIC DEVICE INCLUDING A FERROELECTRIC TRANSISTOR

(71) Applicant: SK hynix Inc., Icheon (KR)

(72) Inventor: Hyung-Dong Lee, Hwaseong (KR)

(73) Assignee: SK hynix Inc., Icheon (KR)

( * ) Notice: Subject to any disclaimer, the term of this patent is extended or adjusted under 35 U.S.C. 154(b) by 1073 days.

(21) Appl. No.: 15/802,322

(22) Filed: Nov. 2, 2017

(65) Prior Publication Data
US 2018/0300626 A1    Oct. 18, 2018

(30) Foreign Application Priority Data
Apr. 18, 2017  (KR) .................. 10-2017-0049629

(51) Int. Cl.
| | |
|---|---|
| G06N 3/08 | (2006.01) |
| G06N 3/063 | (2006.01) |
| G06N 3/04 | (2006.01) |
| H01L 29/772 | (2006.01) |

(52) U.S. Cl.
CPC .............. G06N 3/08 (2013.01); G06N 3/049 (2013.01); G06N 3/0635 (2013.01); H01L 29/772 (2013.01)

(58) Field of Classification Search
CPC ............................ G06N 3/0635; G06N 3/063
See application file for complete search history.

(56) References Cited

U.S. PATENT DOCUMENTS

| | | | | |
|---|---|---|---|---|
| 4,956,564 | A | * | 9/1990 | Holler .................. G06N 3/063 365/185.03 |
| 5,047,655 | A | * | 9/1991 | Chambost .............. G06N 3/063 706/33 |
| 5,336,936 | A | * | 8/1994 | Allen ..................... G06N 3/063 365/185.03 |
| 8,965,821 | B2 | | 2/2015 | Nishitani et al. |
| 2002/0030205 | A1 | * | 3/2002 | Varshavsky ............ G06N 3/063 257/208 |
| 2002/0185690 | A1 | * | 12/2002 | Ueda .................... G11C 27/005 257/368 |
| 2012/0084241 | A1 | * | 4/2012 | Friedman ............... G06N 3/049 706/27 |
| 2014/0289179 | A1 | * | 9/2014 | Di Castro ............... G06G 7/163 706/25 |
| 2015/0100532 | A1 | | 4/2015 | Yamaguchi |
| 2016/0173072 | A1 | | 6/2016 | Taghivand et al. |
| 2017/0083810 | A1 | * | 3/2017 | Ielmini ................. G06N 3/063 |
| 2018/0012123 | A1 | * | 1/2018 | Han ...................... G06N 3/049 |

OTHER PUBLICATIONS

Lecerf et al. (Silicon Neuron dedicated to Memristive Spiking Neural Networks, Jul. 2014, pp. 1568-1571) (Year: 2014).*
Kaneko et al. (Ferroelectric Artificial Synapses for Recognition of a Multishaded Image, Aug. 2014, pp. 2827-2833) (Year: 2014).*

* cited by examiner

Primary Examiner — George Giroux

(57) ABSTRACT

A synapse system of a neuromorphic device may include a pre-synaptic neuron; a pre-synaptic line extending from the pre-synaptic neuron in a first direction; a post-synaptic neuron; a post-synaptic line extending from the post-synaptic line in a second direction; a selecting controller; a selecting line extending from the selecting controller in a third direction; and a synapse electrically connected with the pre-synaptic line, the post-synaptic line, and the selecting line.

14 Claims, 9 Drawing Sheets

SYNAPSE SYSTEM OF A NEUROMORPHIC DEVICE INCLUDING A FERROELECTRIC TRANSISTOR

CROSS-REFERENCE TO RELATED APPLICATIONS

This U.S. non-provisional patent application claims priority under 35 U.S.C. § 119(a) to Korean Patent Application No. 10-2017-0049629, which was filed in the Korean Intellectual Property Office (KIPO) on Apr. 18, 2017, the disclosure of which is incorporated herein by reference in its entirety.

BACKGROUND

1. Field

The present disclosure relates to a synapse system of a neuromorphic device including a ferroelectric transistor.

2. Description of the Related Art

Recently, much attention has been paid to devices in the field of neuromorphic technology, which use chips that mimic the human brain. A neuromorphic device based on the neuromorphic technology includes a plurality of pre-synaptic neurons, a plurality of post-synaptic neurons, and a plurality of synapses. The neuromorphic device outputs pulses or spikes having various levels, amplitude, and/or times, according to a learning state of the neuromorphic device. In order to learn various data patterns, a synaptic system of the neuromorphic device should have multiple resistance state levels. A synaptic system is capable of learning a greater variety of data patterns when the synaptic system has a greater number of resistance state levels.

SUMMARY

Embodiments of the present disclosure provide a neuromorphic device including a post-synaptic neuron having multiple resistance state levels.

Embodiments of the present disclosure provide a synapse system of a neuromorphic device having a ferroelectric transistor.

The objectives of the present disclosure are not limited to the above-mentioned objectives, and it would be obvious to those skilled in the art that there may be other objectives that are not mentioned above.

In accordance with an embodiment of the present disclosure, a synapse system of a neuromorphic device may include a pre-synaptic neuron; a pre-synaptic line extending from the pre-synaptic neuron in a first direction; a post-synaptic neuron; a post-synaptic line extending from the post-synaptic line in a second direction; a selecting controller; a selecting line extending from the selecting controller in a third direction; and a synapse electrically connected with the pre-synaptic line, the post-synaptic line, and the selecting line.

The synapse may include a ferroelectric transistor and a resistive element connected with each other in series.

A gate electrode of the ferroelectric transistor may be electrically connected with the selecting line.

The pre-synaptic line may be electrically connected with a drain electrode of the ferroelectric transistor.

A source electrode of the ferroelectric transistor may be electrically connected with a first electrode of the resistive element.

A second electrode of the resistive element may be electrically connected with the post-synaptic line.

The resistive element may include a fixed resistive element.

The first direction and the second direction may be in parallel with each other.

In accordance with an embodiment of the present disclosure, a synapse system of a neuromorphic device may include a pre-synaptic neuron; a pre-synaptic line extending from the pre-synaptic neuron in a first direction; a post-synaptic neuron; a post-synaptic line extending from the post-synaptic line in a second direction; a synapse electrically connected with the pre-synaptic line and the post-synaptic line; and a common resistive element on the post-synaptic line between the synapse and the post-synaptic neuron.

The synapse may include a ferroelectric transistor.

The synapse system may further include a selecting controller; and a selecting line extending from the selecting controller in a third direction. The selecting line may be electrically connected with a gate electrode of the ferroelectric transistor.

The pre-synaptic line may be electrically connected with a drain electrode of the ferroelectric transistor.

The post-synaptic line may be electrically connected with a source electrode of the ferroelectric transistor.

The common resistive element may include a fixed resistive element.

The common resistive element may include a first node and a second node. The first node may be electrically connected with the synapse through the post-synaptic line. The second node may be electrically connected with the post-synaptic neuron.

The synapse system may further include a pass transistor electrically connected with the first node of the first common resistive element.

The pass transistor may include a gate electrode electrically connected with a column selection signal node, a first source/drain node electrically connected with a reference voltage node, and a second source/drain node electrically connected with the first node of the common resistive element.

The synapse may further include a metal oxide semiconductor (MOS) transistor.

A gate electrode of the MOS transistor may be electrically connected with a gate electrode of the ferroelectric transistor.

A drain electrode of the MOS transistor may be electrically connected with the pre-synaptic line.

A source electrode of the MOS transistor may be electrically connected with a drain electrode of the ferroelectric transistor.

A drain electrode of the ferroelectric transistor may be electrically connected with the pre-synaptic line.

A source electrode of the ferroelectric transistor may be electrically connected with a drain electrode of the MOS transistor.

In accordance with an embodiment of the present disclosure, a synapse system of a neuromorphic device may include a pre-synaptic neuron, a post-synaptic neuron, a synapse electrically connected with the pre-synaptic neuron and the post-synaptic neuron, the synapse including a ferroelectric transistor, and a resistive element between the ferroelectric transistor and the post-synaptic neuron.

Details of other embodiments are included in the detailed is description and drawings.

DETAILED DESCRIPTION

Figure 1A:
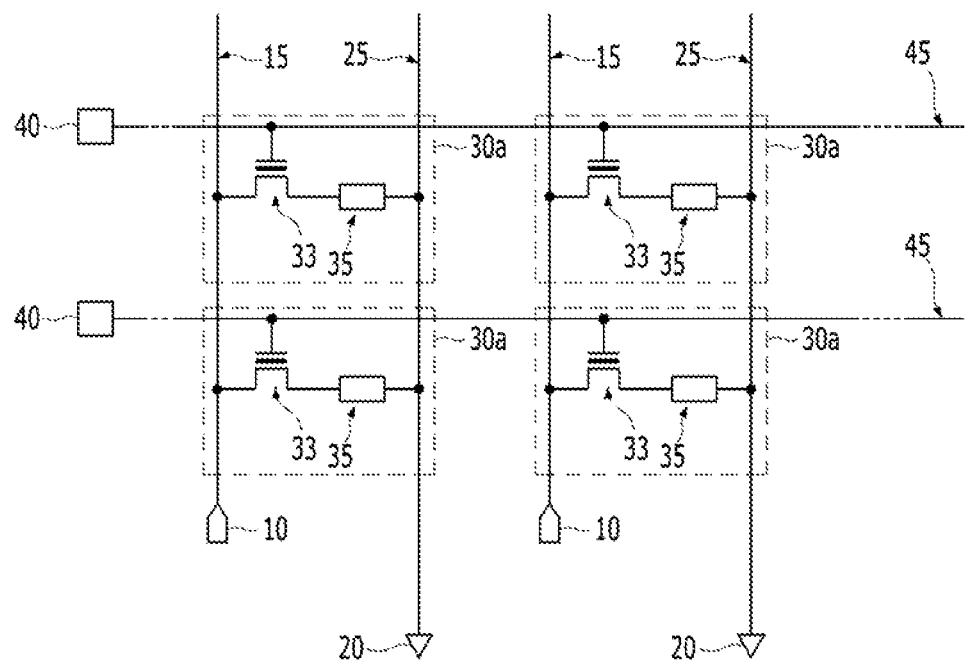
FIGS. 1A and 1B are diagrams schematically illustrating synapse systems of neuromorphic devices in accordance with embodiments of the present disclosure.

Various embodiments will be described below in more detail with reference to the accompanying drawings. Embodiments of the present disclosure may, however, have different forms and should not be construed as limited to the embodiments set forth herein. Rather, these embodiments are provided so that this disclosure will be thorough and complete, and will sufficiently convey the scope of the claims to those skilled in the art.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

Figure 1B:
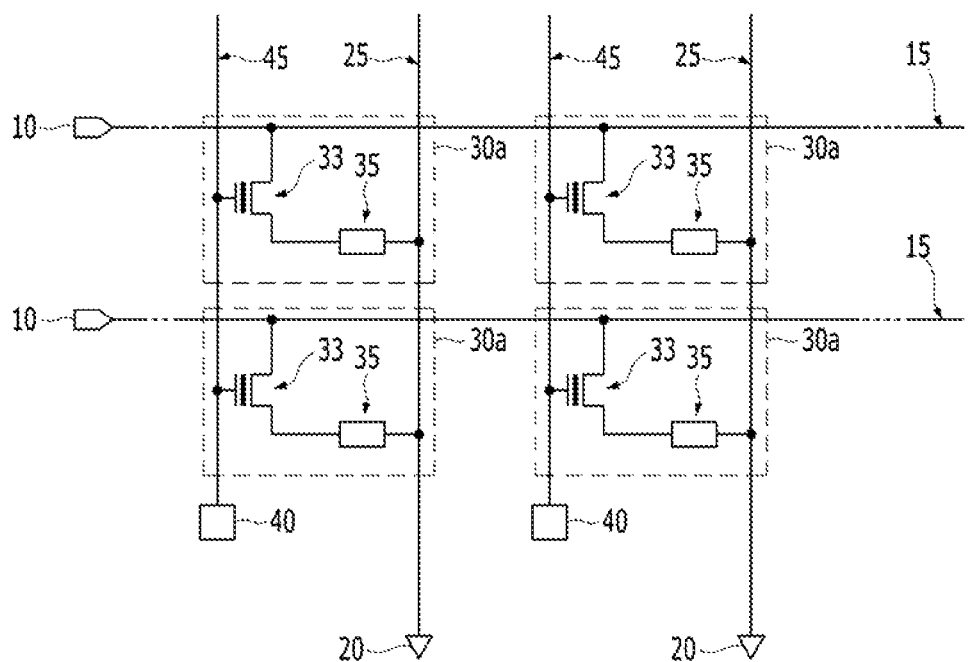

FIGS. 1A and 1B are diagrams schematically illustrating synapse systems of neuromorphic devices in accordance with embodiments of the present disclosure.

Referring to FIG. 1A, a synapse system of a neuromorphic device in accordance with an embodiment of the present disclosure may include a plurality of pre-synaptic neurons 10, a plurality of pre-synaptic lines 15, a plurality of post-synaptic neurons 20, a plurality of post-synaptic lines 25, a plurality of synapses 30a, a plurality of selecting controllers 40, and a plurality of selecting lines 45.

The pre-synaptic lines 15 may extend from the pre-synaptic neurons 10 in a column direction and in parallel with each other. The post-synaptic lines 25 may extend from the post-synaptic neurons 20 in the column direction and in parallel with each other. The selecting lines 45 may extend from the selecting controllers 40 in a row direction and in parallel with each other. The pre-synaptic lines 15 and the post-synaptic lines 25 may be in parallel with each other.

The synapses 30a may be disposed in intersection regions between the pre-synaptic lines 15 and the selecting lines 45, or the post-synaptic lines 25 and the selecting lines 45. That is, the synapses 30a may be connected between the pre-synaptic lines 15 and the selecting lines 45, or between the post-synaptic lines 25 and the selecting lines 45, and may be disposed in regions where the pre-synaptic lines 15 and the selecting lines 45, or the post-synaptic lines 25 and the selecting lines 45, intersect in a direction perpendicular to the column direction and the row direction.

Each of the synapses 30a may include a ferroelectric field effect transistor (FeFET) 33 and a resistive element 35. Gate electrodes of the ferroelectric field effect transistors 33 may be electrically connected with the selecting controllers 40 through the selecting lines 45, respectively. Drain electrodes of the ferroelectric field effect transistors 33 may be electrically connected with the pre-synaptic neurons 10 through the pre-synaptic lines 15, respectively. Source electrodes of the ferroelectric field effect transistors 33 may be electrically connected with first electrodes of the resistive elements 35, respectively. Second electrodes of the resistive elements 35 may be electrically connected with the post-synaptic neurons 20 through the post-synaptic lines 25, respectively. The drain electrodes and the source electrodes of the ferroelectric field effect transistors 33 may be exchangeable with each other according to embodiments.

Each of the resistive elements 35 may include at least one of a variable resistive element or a fixed resistive element. The variable resistive element may be a resistive element that is capable of having different resistance values. The fixed resistive element may be a resistive element that is capable of having a single resistance value.

The synapses 30a electrically connected in common with one of the pre-synaptic lines 15 and one of the post-synaptic lines 25 may be electrically connected with different selecting lines 45, respectively. The synapses 30a electrically connected in common with one of the selecting lines 45 may be electrically connected with different pre-synaptic lines 15 is and with different post-synaptic lines 25, respectively.

Referring to FIG. 1B, a synapse system of a neuromorphic device in accordance with an embodiment of the present disclosure may include a plurality of pre-synaptic neurons 10, a plurality of pre-synaptic lines 15, a plurality of post-synaptic neurons 20, a plurality of post-synaptic lines 25, a plurality of synapses 30a, a plurality of selecting controllers 40, and a plurality of selecting lines 45. The pre-synaptic lines 15 may extend from the pre-synaptic neurons 10 in the row direction and in parallel with each other. The post-synaptic lines 25 may extend from the post-synaptic neurons 20 in the column direction and in parallel with each other. The selecting lines 45 may extend from the selecting controllers 40 in the column direction and in parallel with each other. That is, the post-synaptic lines 25 and the selecting lines 45 may be in parallel with each other.

The synapses 30a electrically connected in common with one of the selecting lines 45 and one of the post-synaptic lines 25 may be electrically connected with different pre-synaptic lines 15, respectively. The synapses 30a electrically connected in common with one of the pre-synaptic lines 15 may be electrically connected with different post-synaptic lines 25 and with different selecting lines 45, respectively.

Figure 2A:
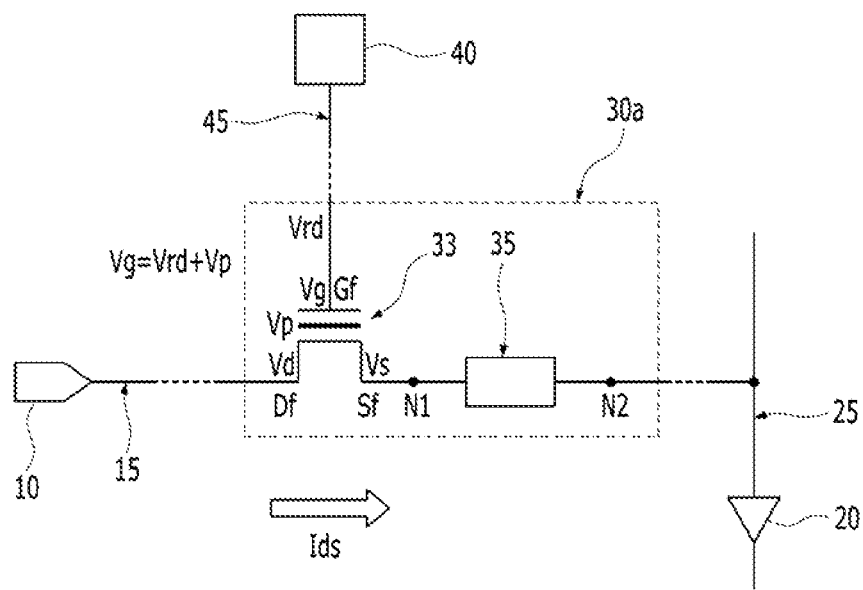
FIG. 2A is a diagram illustrating an operation of a synapse shown in FIGS. 1A or 1B.

FIG. 2A is a diagram showing an operation of a synapse shown in FIGS. 1A or 1B.

Referring to FIG. 2A, in a read-out mode, a read voltage Vrd may be applied to a gate electrode Gf of the ferroelectric transistor 33 from the selecting controller 40, and a drain voltage Vd may be applied to a drain is electrode Df of the ferroelectric transistor 33 from the pre-synaptic neuron 10. A source voltage Vs may be applied to a source electrode Sf of the ferroelectric transistor 33.

For convenience of description, it is assumed that the source voltage Vs being applied to the source electrode Sf, which corresponds to a first node N1 of the resistive element 35, from the post-synaptic neuron 20 via the resistive element 35, that is, a voltage being applied to a second node N2 of the resistive element 35, may be substantially 0 V (zero volts). Furthermore, it is assumed that the gate electrode Gf of the ferroelectric transistor 33 is polarized and has a polarization voltage Vp. That is, a gate voltage Vg of the ferroelectric transistor 33 may be a sum of the read voltage Vrd and the polarization voltage Vp. (Vg=Vrd+Vp).

A voltage difference Vgs between the gate voltage Vg and the source voltage Vs of the ferroelectric transistor 33 may be smaller than a threshold voltage Vth of the ferroelectric transistor 33, i.e., Vgs=(Vg−Vs)<Vth. Since the source voltage Vs is assumed to be substantially 0V, the gate voltage Vg of the ferroelectric transistor 33 may be a positive voltage that is lower than the threshold voltage Vth of the ferroelectric transistor 33, i.e., Vth>Vg>0. The drain voltage Vd of the ferroelectric transistor 33 may have a positive voltage that is greater than the gate voltage Vg of the ferroelectric transistor 33, i.e., Vd>Vg.

In the embodiment, the gate-source voltage Vgs of the ferroelectric transistor 33, which is equal to Vg−Vs, has a lower magnitude than the threshold voltage Vth of the ferroelectric transistor 33. That is, |Vgs|<Vth. Accordingly, the ferroelectric transistor 33 may be in a turn-off state. However, since a voltage difference between the drain voltage Vd and the source voltage Vs is greater than the threshold voltage Vth of the ferroelectric transistor 33, a transistor current Ids can flow from the drain electrode Df to the source electrode Sf of the ferroelectric transistor 33. That is, the transistor current Ids flows from the drain electrode Df to the source electrode Sf when the drain-source voltage Vds of the ferroelectric transistor 33 is greater than the threshold voltage Vth of the ferroelectric transistor 33. That is, an operation of reading a synapse weight of the synapse 30 can be performed when the ferroelectric transistor 33 is turned off.

In an embodiment, the read voltage Vrd may be substantially 0 V. For example, the gate voltage Vg and the polarization voltage Vp of the ferroelectric transistor 33 may be equal to each other. Accordingly, a read operation can be performed using the polarization voltage Vp, without applying the read voltage Vrd to the gate electrode Gf of the ferroelectric transistor 33.

Figure 2B:
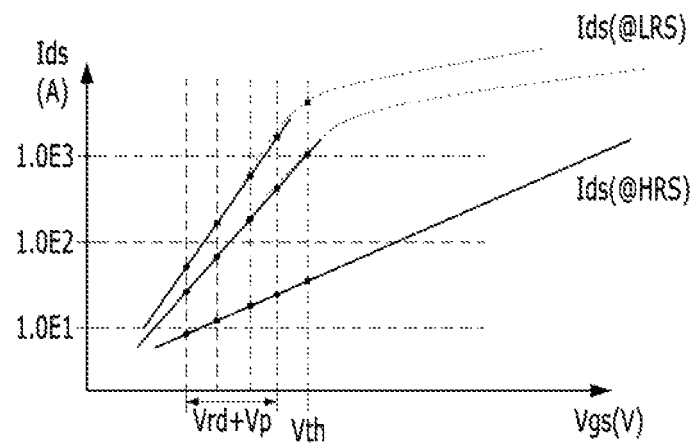
FIG. 2B is a graph schematically showing that a transistor current of a ferroelectric transistor of the synapse shown in FIG. 2A changes when a gate electrode of the ferroelectric transistor based on various polarization voltages in accordance with an embodiment of the present disclosure.

FIG. 2B is a graph schematically showing that a transistor current Ids of the ferroelectric transistor 33 of the synapse shown in FIG. 2A based on various polarization voltages Vp in accordance with an embodiment of the present disclosure. The X-axis represents the gate-source voltage Vgs of the ferroelectric transistor 33, and the Y-axis represents the transistor current Ids. The Y-axis has a logarithmic scale. The label "@HRS" indicates that the resistive element 35 is in a high resistance state, and the is label "@LRS" indicates that the resistive element 35 is in a low resistance state.

Referring to FIG. 2B, at a sub-threshold voltage region where the sum of the read voltage Vrd and the polarization voltage Vp is lower than the threshold voltage Vth, that is, (Vrd+Vp)<Vth, the transistor current Ids changes linearly in the log scale domain. Specifically, when the resistive element 35 is in the high resistance state @HRS, the transistor current Ids may change linearly throughout the entire range of the gate-source voltage Vgs illustrated by FIG. 2B. However, when the resistive element 35 is in the low resistance state @LRS, the transistor current Ids may change linearly, but may change abruptly at different rates depending on whether the gate-source voltage Vgs is less than or greater than the threshold voltage Vth.

Furthermore, when the resistive element 35 has a fixed resistance value, that is, with reference to only a linear change region of the transistor current Ids, the gate voltage Vg may change in accordance with the polarization voltage Vp of the ferroelectric transistor 33, and thus the gate-source voltage Vgs may also change in accordance with the polarization voltage Vp of the ferroelectric transistor 33. Accordingly, the transistor current Ids can also change depending on the polarization voltage Vp of the ferroelectric transistor 33.

According to the present disclosure, when the ferroelectric transistor 33 is in the turn-off state, the transistor current Ids having the linear change can be adjusted by controlling the polarization voltage Vp. is Thus, it is possible to obtain a synapse with a weight having a plurality of states, i.e., multiple synaptic levels, by using the transistor current Ids that changes linearly.

Referring again to FIG. 2A, when the gate voltage Vg of the ferroelectric transistor 33 is larger than the threshold voltage Vth, the ferroelectric transistor 33 can be turned on. When the ferroelectric transistor 33 is in the turn-on state, the polarization of the gate electrode Gf can be intensified or weakened by the drain-source voltage Vds. That is, the polarization voltage Vp of the ferroelectric transistor 33 can change. As the polarization voltage Vp of the ferroelectric transistor 33 changes, the gate voltage Vg of the ferroelectric transistor 33 can have various levels. Accordingly, in a polarization control mode, the gate voltage Vg of the ferroelectric transistor 33 can be sufficiently greater than the threshold voltage Vth, such that the ferroelectric transistor 33 is turned on.

When the resistive element 35 includes a variable resistive element, the resistive element 35 can be potentiated or depressed. In other words, a resistance of the resistive element 35 may be lowered or raised. For example, when the ferroelectric transistor 33 is in the turn-on state and the drain voltage Vd is greater than the source voltage Vs, an electrical signal may be applied to the resistive element 35 from the pre-synaptic neuron 10, such that the synapse may be in an excitatory synapse state. In contrast, when the ferroelectric transistor 33 is in the turn-on state and the source voltage Vs is greater than the drain voltage Vd, an electrical signal may be applied to the resistive element 35 from the post-synaptic neuron 20, such is that the synapse may be in an inhibitory synapse state. That is, when the resistive element 35 includes a variable resistive element, the resistive element 35 can be potentiated or depressed depending on a relationship between a magnitude of the drain voltage Vd and a magnitude of the source voltage Vs.

Figure 3A:
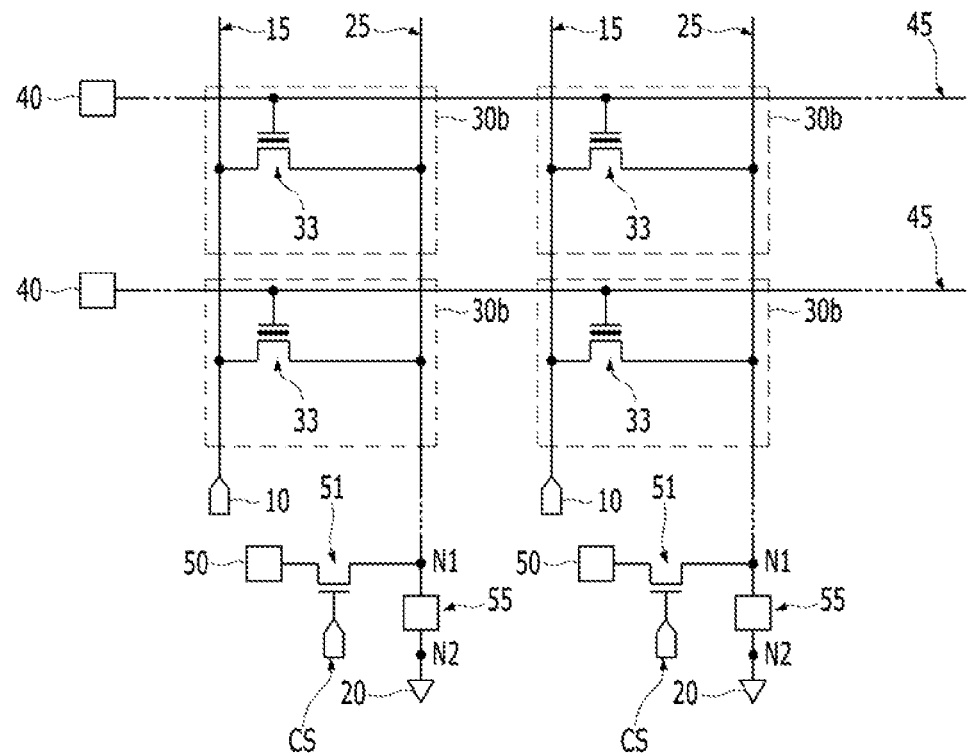
FIGS. 3A and 3B are diagrams schematically illustrating synapse systems of neuromorphic devices in accordance with embodiments of the present disclosure.
Figure 3B:
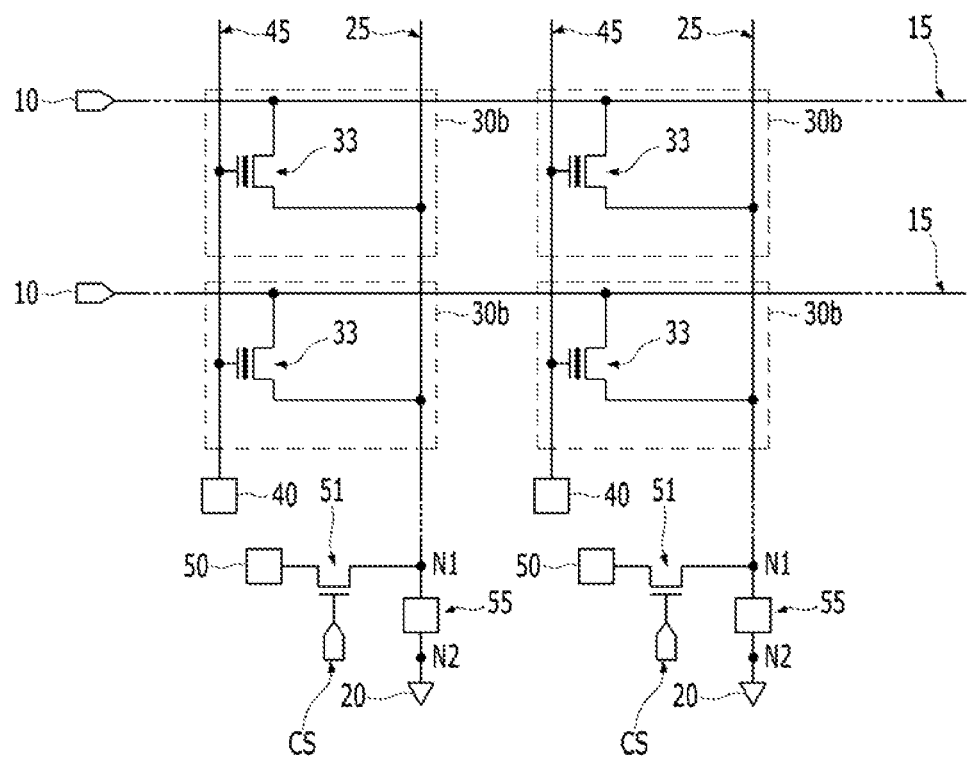

FIGS. 3A and 3B are diagrams schematically illustrating synapse systems of neuromorphic devices in accordance with embodiments of the present disclosure.

Referring to FIG. 3A, a synapse system of a neuromorphic device in accordance with an embodiment of the present disclosure may include pre-synaptic neurons 10, pre-synaptic lines 15, post-synaptic neurons 20, post-synaptic lines 25, synapses 30b, selecting controllers 40, selecting lines 45, common resistive elements 55, and write-pass transistors 51.

The pre-synaptic lines 15 may extend from the pre-synaptic neurons 10 in a column direction and in parallel with each other. The post-synaptic lines 25 may extend from the post-synaptic neurons 20 in the column direction and in parallel with each other. The selecting lines 45 may extend in a row direction and in parallel with each other. The pre-synaptic lines 15 and the post-synaptic lines 25 may be in parallel with each other.

A plurality of the synapses 30b electrically connected in common with one of the pre-synaptic lines 15 and one of the post-synaptic lines 25 may be electrically connected with different selecting lines 45, respectively. The synapses 30b may include ferroelectric transistors 33, respectively, and may not include any individual resistive elements. Accordingly, the ferroelectric transistors 33 having gate electrodes electrically connected in common to one of the selecting lines 15 can be electrically connected with different pre-synaptic lines 15 and with different post-synaptic lines 25, respectively.

The common resistive elements 55 may be disposed on the post-synaptic lines 25, respectively. The common resistive elements 55 may be disposed between the synapses 30b and the post-synaptic neurons 20, respectively. Specifically, first nodes N1 of the common resistive elements 55 may be electrically connected with the synapses 30b through the post-synaptic lines 25, and second nodes N2 of the common resistive elements 55 may be electrically connected with the post-synaptic neurons 20. The common resistive elements 55 may include at least one of a variable resistive element and a fixed resistive element. When the common resistive elements 55 include the fixed resistive element, the common resistive elements 55 may each include a passive device such as a resistive conductor or may include an active device, e.g., a resistive transistor. The resistive conductor may include a doped silicon device.

A gate electrode of the write-pass transistor 51 may be electrically connected with a column selection signal node by which a column selection signal CS is applied, a first source/drain electrode of the write-pass transistor 51 may be electrically connected with a reference voltage node 50, and a second source/drain electrode of the write-pass transistor 51 may be electrically connected with the first node N1 of one of the common resistive elements 55. The gate electrode of the write-pass transistor may receive the column selection signal CS.

Referring to FIG. 3B, a synapse system of a neuromorphic device in accordance with an embodiment of the present disclosure, in comparison with the synapse system shown in FIG. 3A, may include the pre-synaptic lines 15 extending in the row direction and in parallel with each other, and the selecting lines 45 extending in the column direction and in parallel with each other. That is, the post-synaptic lines 25 and the selecting lines 45 may extend in parallel with each other. The synapses 30b that are electrically connected in common with one of the pre-synaptic lines 15 may be connected with different selecting lines 45 and with different post-synaptic lines 25, respectively. The synapses 30b electrically connected in common with one of the selecting lines 45 and one of the post-synaptic lines 25 may be electrically connected with different pre-synaptic lines 15, respectively.

Figure 4A:
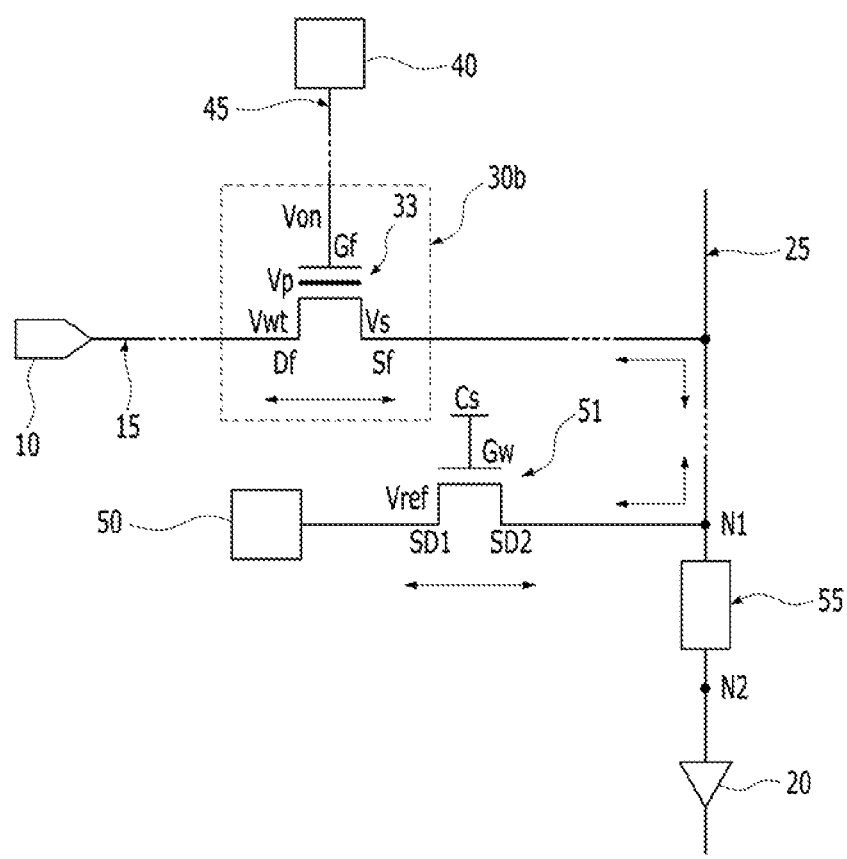
FIG. 4A is a diagram schematically illustrating a method of adjusting a polarization voltage of a gate electrode of a ferroelectric transistor of a synapse of the synaptic systems shown in FIGS. 3A and 3B.

FIG. 4A is a diagram schematically illustrating a method of adjusting a polarization voltage Vp of a gate electrode Gf of a ferroelectric transistor 33 of a synapse of the synaptic systems shown in FIGS. 3A and 3B.

Referring to FIG. 4A, the method of adjusting the polarization voltage Vp of the gate electrode Gf of the ferroelectric transistor 33 may include applying a turn-on voltage Von to the gate electrode Gf of the ferroelectric transistor 33 from the selecting controller 40, applying a write voltage Vwt to a drain electrode Df of the ferroelectric transistor 33 from the pre-synaptic neuron 10, applying a column selection signal CS to a gate electrode Gw of the write-pass transistor 51, and applying a reference voltage Vref to a first source/drain electrode SD1 of the write-pass transistor 51 from the reference voltage node 50.

The turn-on voltage Von may turn on the ferroelectric transistor 33. The column selection signal CS may turn on the write-pass transistor 51. Accordingly, a current may flow through the ferroelectric transistor 33 in accordance with a voltage difference between the write voltage Vwt applied to the drain electrode Df of the ferroelectric transistor 33 and the reference voltage Vref applied to the first source/drain electrode DS1 of the write-pass transistor 51. For example, when the write voltage Vwt is greater than the reference voltage Vref, the current may flow from the drain electrode Df to a source electrode Sf of the ferroelectric transistor 33. Otherwise, when the write voltage Vwt is lower than the reference voltage Vref, the current may flow from the source electrode Sf to the drain electrode Df of the ferroelectric transistor 33. The arrows illustrated in FIG. 4A may indicate the direction in which the current flows. In any case, the current may flow through the ferroelectric transistor 33, and thus the gate electrode Gf of the ferroelectric transistor 33 may be polarized.

The amount of the current flowing through the ferroelectric transistor 33 can be adjusted by combining the turn-on voltage Von and the write voltage Vwt, so that the polarization voltage Vp of the gate electrode Gf of the ferroelectric transistor 33 may be adjusted. In the present embodiment, it is assumed that the column selection signal CS and the reference voltage Vref each have a fixed voltage. In specific embodiments of the present disclosure, the reference voltage Vref may selectively have one of a power supply voltage Vdd and a ground voltage Vss, in accordance with an operation mode of the synapse 30b. The operation mode, for example, could be a read-out mode or a polarization control mode.

Figure 4B:
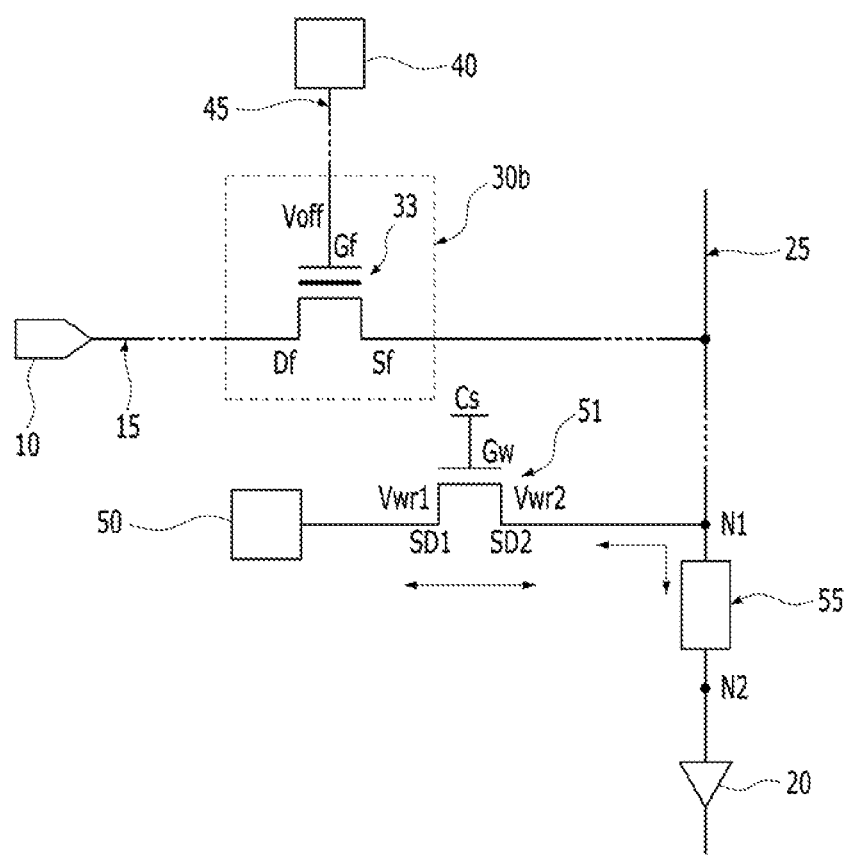
FIG. 4B is a diagram schematically illustrating a method of adjusting a resistance value of a common resistive element of the synapse of the synapse systems shown in FIGS. 3A and 3B.

FIG. 4B is a diagram schematically illustrating a method of adjusting a resistance value of a common resistive element 55 of the synapse 30b of the synapse systems shown in FIGS. 3A and 3B.

In the embodiment illustrated in FIG. 4B, the common resistive element 55 may include a variable resistive element. Referring to FIG. 4B, the method of adjusting the resistance value of the common resistive element 55 may include applying an off-voltage Voff to the gate electrode Gf of the ferroelectric transistor 33, thereby turning off the ferroelectric transistor 33; applying a column selection signal CS to the gate electrode Gw of the write-pass transistor 51, thereby turning on the write-pass transistor 51; applying a first resistance write voltage Vwr1 to a first source/drain electrode SD1 of the write-pass transistor 51 from the reference voltage node 50; and applying a second resistance write voltage Vwr2 to a second source/drain electrode SD2 of the write-pass transistor 51 from the post-synaptic neuron 20.

The off voltage Voff may sufficiently lower than the threshold voltage Vth, such that the ferroelectric transistor 33 may be in a turn-off state when the off voltage Voff is applied to the gate electrode Gf of the ferroelectric transistor 33. For example, the off voltage Voff may be 0 V or a negative (−) voltage.

When the write-pass transistor 51 is turned on, a voltage difference between the first resistance write voltage Vwr1 and the second resistance write voltage Vwr2 may be applied to the common resistive element 55. For example, when the first resistance write voltage Vwr1 is greater than the second resistance write voltage Vwr2 by at least a set voltage Vset, a set pulse may be applied from the first node N1 to the second node N2 of the common resistive element 55, which lowers the resistance value of the common resistive element 55 (i.e., a potentiating operation). Or, when the first resistance write voltage Vwr1 is lower than the second resistance write voltage Vwr2 by a reset voltage Vreset or more, a reset pulse is applied from the second node N2 to the first node N1 of the common resistive element 55, which increases the resistance value of the common resistive element 55 (i.e., a depressing operation). The first and second resistance write voltages Vwr1 and Vwr2 may be applied in the form of pulses that can lower or increase the resistance value of the common resistive element 55.

In another embodiment of the present disclosure, the common resistive element 55 may have a fixed resistance value. In this case, the method of adjusting the resistance value of the common resistive element 55 described with reference to FIG. 4B may not be performed. Accordingly, a synapse weight of the synapse 30b may have various levels depending on only the polarization voltage Vp of the ferroelectric transistor 33.

Figure 4C:
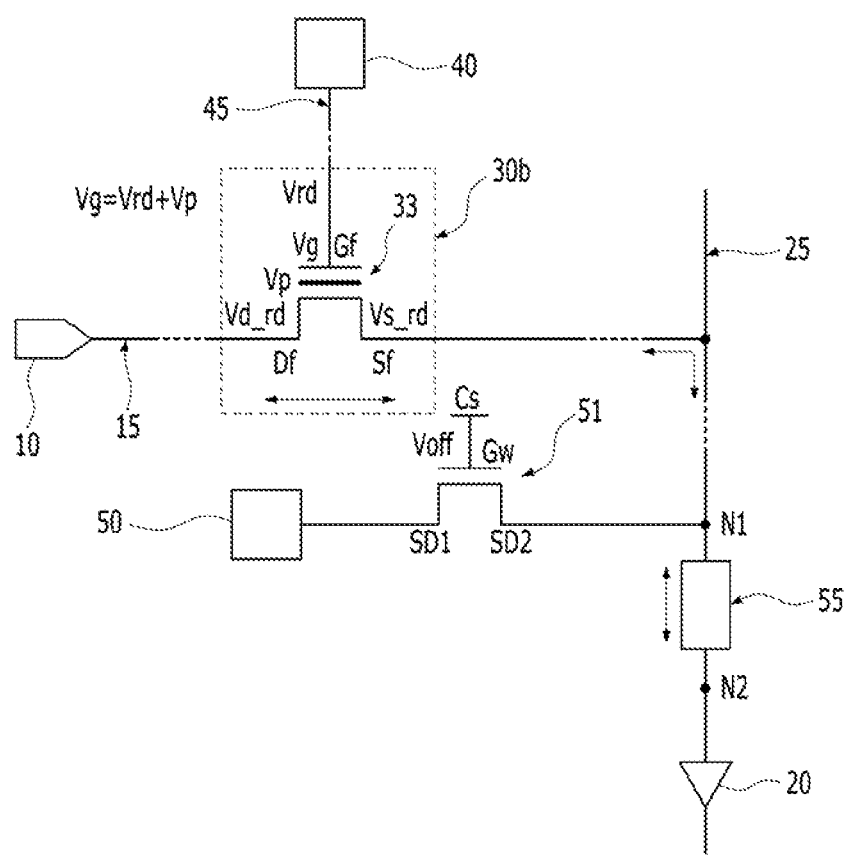
FIG. 4C is a diagram schematically describing a method of reading synapse weights of the synapses of the synaptic systems shown in FIGS. 3A and 3B.

FIG. 4C is a diagram illustrating a method of reading the synapse weights of the synapses 30b of the synaptic systems shown in FIGS. 3A and 3B. Referring to FIG. 4C, the method of reading the synaptic weights of the synapses 30b of the synaptic systems of the neuromorphic devices may include applying the read voltage Vrd to the gate electrode Gf of the ferroelectric transistor 33, applying a read drain voltage Vd_rd to the drain electrode Df of the ferroelectric transistor 33 from the pre-synaptic neuron 10, and applying an off voltage Voff to the gate electrode Gw of the write-pass transistor 51. Referring again to FIG. 2A, the method may further include applying a read source voltage Vs_rd to the source electrode Sf of the ferroelectric transistor 33 through the common resistive element 55 from the post-synaptic neuron 20.

The gate voltage Vg of the ferroelectric transistor 33 may be the sum of the polarization voltage Vp of the ferroelectric transistor 33 and the read voltage Vrd (i.e., Vg=Vrd+Vp). A voltage difference between the gate voltage Vg and the read source voltage Vs_rd may be lower than the threshold voltage Vth of the ferroelectric transistor 33 (i.e., (Vg−Vs_rd)=Vgs<Vth). The off voltage Voff may have a sufficiently low voltage to allow the write-pass transistor 51 to be in the turn-off state. Various levels of voltage and/or current may be input to the post-synaptic neuron 20 depending on the polarization voltage Vp of the ferroelectric transistor 33 and the resistance state of the common resistive element 55. More detailed descriptions may be understood with reference to FIGS. 2A and 2B.

The synaptic systems of the neuromorphic devices described with reference to FIGS. 3A and 3B can utilize the resistance states of the common resistive element 55, in addition to the state levels of the is ferroelectric transistor 33 constituting the synapse 30b, in order to increase the number of synaptic weight levels of the synaptic system.

Figure 5A:
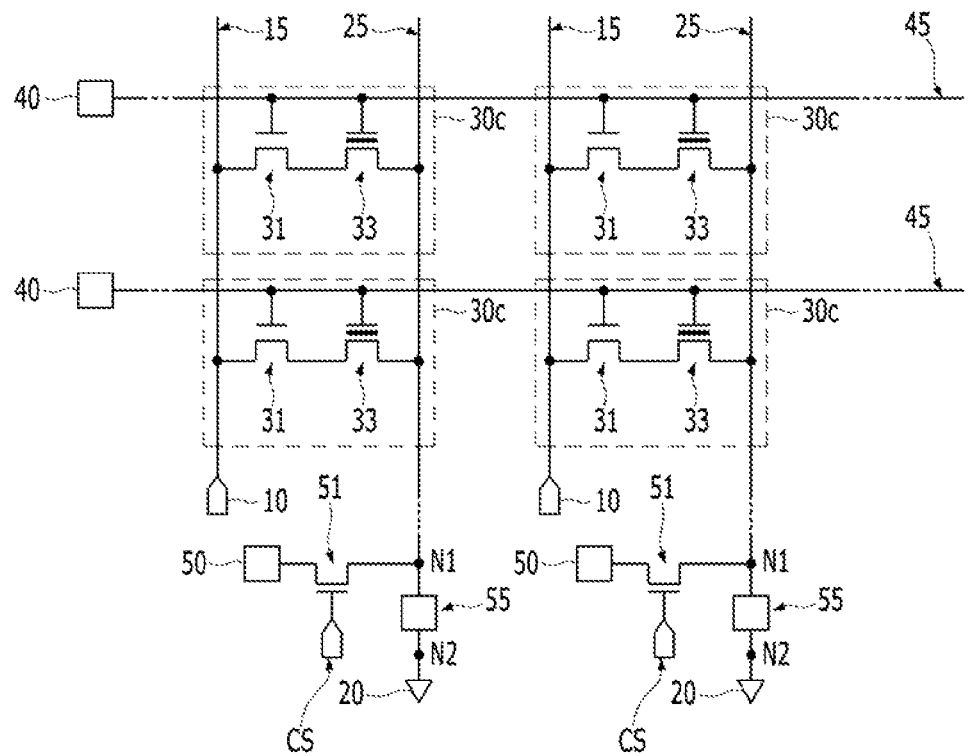
FIGS. 5A and 5B are diagrams illustrating synapse systems of neuromorphic devices in accordance with embodiments of the present disclosure.
Figure 5B:
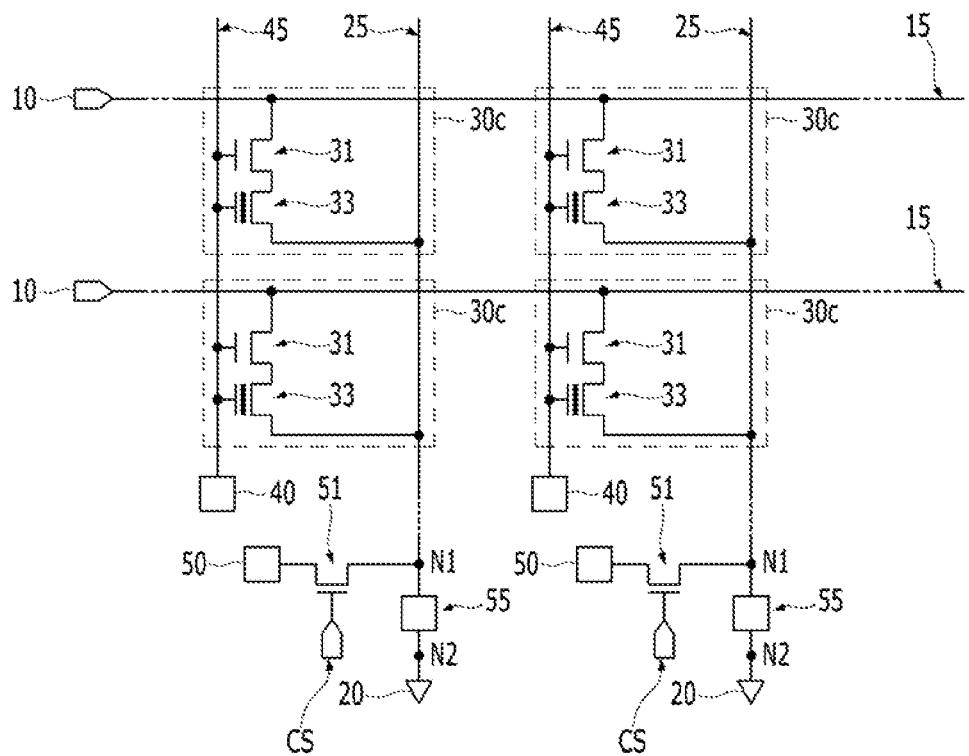

FIGS. 5A and 5B are diagrams illustrating synapse systems of neuromorphic devices in accordance with embodiments of the present disclosure. Referring to FIG. 5A, the synapse system of the neuromorphic device in accordance with the embodiment of the present disclosure may include pre-synaptic neurons 10, pre-synaptic lines 15, post-synaptic neurons 20, post-synaptic lines 25, synapses 30c, selecting controllers 40, selecting lines 45, common resistive elements 55, and write-pass transistors 51. The pre-synaptic lines 15 may extend from the pre-synaptic neurons 10 in a column direction and in parallel with each other, the post-synaptic lines 25 may extend from the post-synaptic neurons 20 in the column direction and in parallel with each other, and the selecting lines 45 may extend from the selecting controllers 40 in a row direction and in parallel with each other. The pre-synaptic lines 15 and the post-synaptic lines 25 may be in parallel with each other.

Each of the synapses 30c may include two transistors 31 and 33 connected with each other in series. Specifically, each of the synapses 30c may include a metal oxide semiconductor (MOS) transistor 31 and a ferroelectric transistor 33 connected with each other in series. In the same synapse 30c, gate electrodes of the MOS transistor 31 and the ferroelectric transistor 33 may be commonly connected with the same selecting line 45. Accordingly, the same voltage can be applied to the gate electrodes of the MOS transistor 31 and the ferroelectric transistor 33.

A drain electrode of each of the MOS transistors 31 may be electrically connected with one of the pre-synaptic neurons 10 through a corresponding one of the pre-synaptic lines 15. In the same synapse 30c, a source electrode of the MOS transistor 31 and a drain electrode of the ferroelectric transistor 33 may be connected with each other. A source electrode of each of the ferroelectric transistors 33 may be electrically connected with one of the common resistive elements 55 and one of the post-synaptic neurons 20 through a corresponding one of the post-synaptic lines 25. Each of the common resistive elements 55 may include a variable resistive element or a fixed resistive element.

Although not depicted in FIG. 5A, in another embodiment of the present disclosure, in the same synapse 30c, the drain electrode of the ferroelectric transistor 33 may be electrically connected with one of the pre-synaptic neurons 10 through a corresponding one of the pre-synaptic lines 15, the source electrode of the ferroelectric transistor 33 and the drain electrode of the MOS transistor 31 may be connected with each other, and the source electrode of the MOS transistor 31 may be electrically connected with the common resistive element 55 and the post-synaptic neuron 20 through one of the post-synaptic lines 25. In this embodiment, each of the common resistive elements 55 may include a variable resistive element or a fixed resistive element.

Referring to FIG. 5B, in comparison with the synaptic system of the neuromorphic device shown in FIG. 5A, the synaptic system of the neuromorphic device in accordance with an embodiment of the present is disclosure may include pre-synaptic lines 15 extending in the row direction and selecting lines 45 extending in the column direction. That is, the post-synaptic lines 25 and the selecting lines 45 may extend in parallel with each other.

The operation of the synaptic systems of the neuromorphic devices shown in FIGS. 5A and 5B may be understood with reference to FIGS. 4A to 4C. The MOS transistor 31 and the ferroelectric transistor 33 of the synaptic systems shown in FIGS. 5A and 5B can be turned on and turned off at the same time so that a leakage current can be reduced. Accordingly, a power consumption of the synapse system can be reduced and the data retention of a neuromorphic device including the synaptic systems can be improved.

Figure 6A:
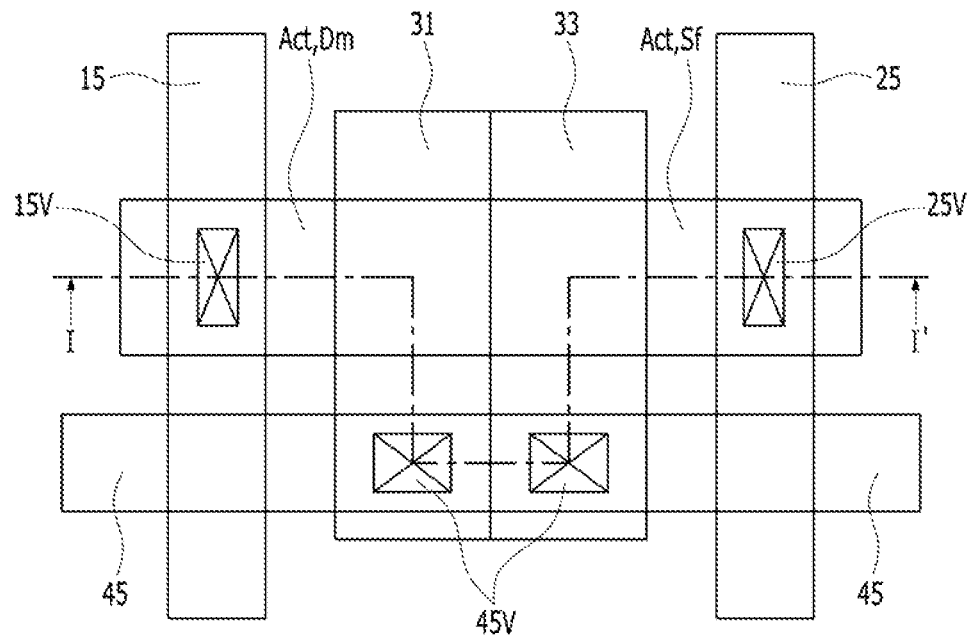
FIG. 6A illustrates a layout of a synapse shown in FIG. 5A.
Figure 6B:
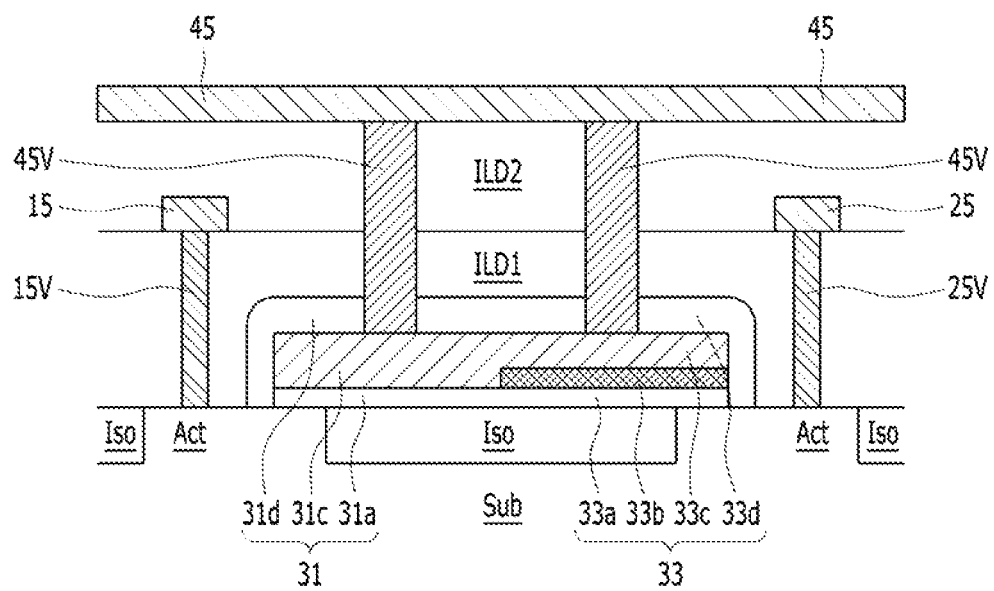
FIG. 6B is a longitudinal cross-sectional view of the synapse shown in FIG. 5A taken along a line I-I' illustrated in FIG. 6A.

FIG. 6A illustrates a layout of a synapse 30 shown in FIG. 5A. FIG. 6B illustrates a longitudinal cross-sectional view of the synapse 30 shown in FIG. 5A taken along the line I-I' illustrated in FIG. 6A.

Referring to FIGS. 6A and 6B, the synapse 30 may include an isolation region Iso formed in a substrate Sub, an MOS transistor 31, a ferroelectric transistor 33, a first interlayer insulating layer ILD1, a second interlayer insulating layer ILD2, a pre-synaptic via plug 15V, a pre-synaptic line 15, a post-synaptic via plug 25V, a post-synaptic line 25, a selecting via plug 45V, and a selecting line 45.

The substrate Sub may include a semiconductor material such as a silicon wafer. The isolation region Iso may define an active region Act in the substrate Sub. The isolation region Iso may include a trench supporting shallow trench isolation (STI).

The MOS transistor 31 and the ferroelectric transistor 33 are disposed over the substrate Sub. The MOS transistor 31 may include a gate insulating layer 31a, a gate electrode layer 31c, and a gate capping layer 31d. The ferroelectric transistor 33 may include a gate insulating layer 33a, a ferroelectric layer 33b, a gate electrode layer 33c, and a gate capping layer 33d. The gate insulating layer 31a, the gate electrode layer 31c, and the gate capping layer 31d of the MOS transistor 33 may be integrated and materially continuous with the gate insulating layer 33a, the gate electrode layer 33c, and the gate capping layer 33d of the ferroelectric transistor 33, respectively. For example, the gate insulating layers 31a and 33a may include silicon oxide ($SiO_2$); the ferroelectric layer 33b may include a ferroelectric material, such hafnium oxide ($Hf_xO_y$) or hafnium zirconium oxide ($Hf_xZr_yO_z$); the gate electrode layers 31c and 33c may include a barrier metal layer, such as titanium nitride (TiN), or a metal layer, such as tungsten (W); and the gate capping layers 31d and 33d may include an insulating material, such as silicon oxide (SiO2), silicon nitride (SiN), silicon oxy-nitride (SiON), or a combination thereof.

The first and the second interlayer insulating layers ILD1 and ILD2 may include one or more insulating materials having excellent filling characteristics and planarizing properties, such as silicon oxide. In an embodiment of the present disclosure, a capping insulating layer, including a material such as silicon nitride (SiN), may be disposed between the first interlayer insulating layer ILD1 and the second interlayer insulating layer is ILD2. The capping insulating layer may include a material, such as silicon nitride (SiN) or silicon oxy-nitride (SiON), which is denser and harder than the first and second interlayer insulating layer ILD1 and ILD2.

Each of the pre-synaptic via plug 15V, the post-synaptic via plug 25V, and the selecting via plug 45V may include a conductive material, such as tungsten (W), copper (Cu), another metal, or a combination thereof. The pre-synaptic line 15, the post-synaptic line 25, and the selecting line 45 may also include a conductive material, such as a metal.

The isolation region Iso may define the active region Act. The active region Act may include a drain electrode Dm and a channel region of the MOS transistor 31, as well as a channel region and a source electrode Sf of the ferroelectric transistor 33. The pre-synaptic via plug 15V may be disposed on the portion of the active region Act that corresponds to the drain electrode Dm of the MOS transistor 31.

The pre-synaptic via plug 15V may vertically penetrate the first interlayer insulating layer ILD1, and may connect the portion of the active region Act corresponding to the drain electrode Dm of the MOS transistor 31 to the pre-synaptic line 15. The post-synaptic via plug 25V may be disposed on the portion of the active region Act that corresponds to the source electrode Sf of the ferroelectric transistor 33. The post-synaptic via plug 25V may vertically penetrate the first interlayer insulating layer ILD1, and may connect the portion of the active region Act corresponding to the source electrode Sf of the ferroelectric transistor 33 to the post-synaptic line 25. The selecting via plugs 45V may vertically penetrate the gate capping layers 31d and 33d and the first and second interlayer insulating layers ILD1 and ILD2, and may connect the gate electrode layer 31c of the MOS transistor 31 and the gate electrode layer 33c of the ferroelectric transistor 33 to the selecting line 45.

The channel region of the MOS transistor 31 and the channel region of the ferroelectric transistor 33 may be spatially continuous. That is, the source region of the MOS transistor 31 and the drain region of the ferroelectric transistor 33 may be omitted.

Referring to FIG. 6B, the selecting line 45 is disposed over the pre-synaptic line 15 and the post-synaptic line 25. In another embodiment of the present disclosure, the pre-synaptic line 15 and the post-synaptic line 25 may be disposed over the selecting line 45.

Figure 7:
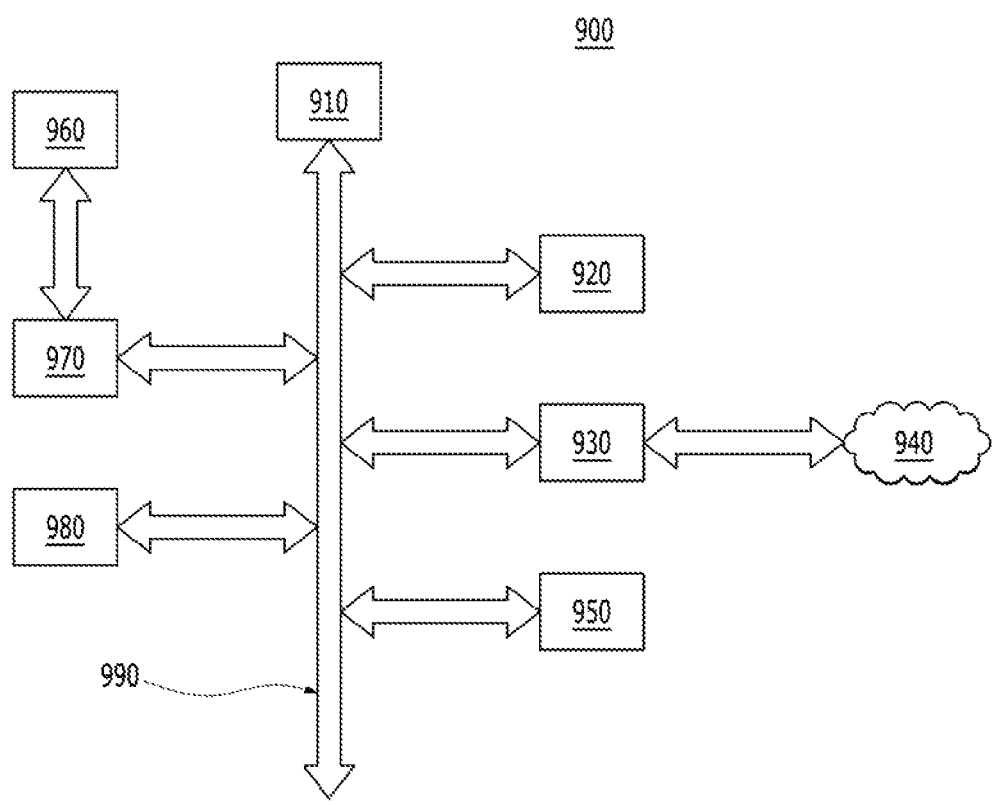
FIG. 7 is a diagram schematically illustrating a pattern recognition system in accordance with an embodiment of the present disclosure.

FIG. 7 is a diagram schematically illustrating a pattern recognition system 900 in accordance with an embodiment of the present disclosure. For example, the pattern recognition system 900 may include a speech recognition system, an imaging recognition system, a code recognition system, a signal recognition system, and one or more systems for recognizing various patterns.

Referring to FIG. 7, the pattern recognition system 900 in accordance with the embodiment of the present disclosure may include a Central Processing Unit (CPU) 910, a memory unit 920, a communication control unit 930, a network 940, an output unit 950, an input unit 960, an Analog-Digital Converter (ADC) 970, a neuromorphic unit 980, and/or a bus 990. The CPU 910 may generate and transmit various signals for a learning process of the neuromorphic unit 980, and perform various is processes and functions for recognizing patterns according to an output from the neuromorphic unit 980. For example, the CPU 910 may perform processes and functions for recognizing speech and imaging patterns based on an output from the neuromorphic unit 980.

The CPU 910 may be connected with the memory unit 920, the communication control unit 930, the output unit 950, the ADC 970, and the neuromorphic unit 980 through the bus 990.

The memory unit 920 may store various pieces of information, which are required to be stored in the pattern recognition system 900. The memory unit 920 may include one or more of a volatile memory device, such as a DRAM or SRAM device, a nonvolatile memory, such as PRAM, MRAM, ReRAM or NAND flash memory, and various memory units, such as Hard Disk Drive (HDD) and Solid State Drive (SSD).

The communication control unit 930 may transmit and/or receive data to and/or from a communication control unit of another system through the network 940. For example, the communication control unit 930 may transmit speech and/or image recognition data through the network 940.

The output unit 950 may output data in various manners. For example, the output unit 950 may include a speaker, a printer, a monitor, a display panel, a beam projector, a hologrammer, or other various output devices. The output unit 950 may output, for example, speech and/or image recognition data.

The input unit 960 may include a microphone, a camera, a scanner, a touch pad, a keyboard, a mouse, a mouse pen, or one or more of various sensors.

The ADC 970 may convert analog data inputted from the input unit 960 into digital data.

The neuromorphic unit 980 may perform learning or recognition using the data outputted from the ADC 970, and output data corresponding to recognized patterns. The neuromorphic unit 980 may include one or more of the neuromorphic devices in accordance with the various embodiments described above.

In accordance with the present disclosure, since a polarization voltage of a gate electrode of a ferroelectric transistor has multiple levels, a synapse system of a neuromorphic device can have multiple state levels.

Although various embodiments have been described for illustrative purposes, it will be apparent to those skilled in the art that various changes and modifications may be made without departing from the spirit and scope of the disclosure, as defined in the following claims.

What is claimed is:

1. A synapse system of a neuromorphic device, the synapse system comprising:
   a pre-synaptic neuron;
   a pre-synaptic line extending from the pre-synaptic neuron in a first direction;
   a post-synaptic neuron;
   a post-synaptic line extending from the post-synaptic neuron in a second direction;
   a selecting controller;
   a selecting line extending from the selecting controller in a third direction;
   a synapse electrically connected with the pre-synaptic line, the post-synaptic line, and the selecting line; and
   a common resistor on the post-synaptic line between the synapse and the post-synaptic neuron,
   wherein the synapse comprises a ferroelectric transistor and a resistor that are connected with each other in series, the resistor having fixed resistance,
   wherein a gate electrode of the ferroelectric transistor is electrically connected with the selecting line,
   wherein the pre-synaptic line is electrically connected with a drain electrode of the ferroelectric transistor,
   wherein a source electrode of the ferroelectric transistor is electrically connected with a first electrode of the resistor,
   wherein a second electrode of the resistor is electrically connected with the post-synaptic line,
   wherein the pre-synaptic line and the selecting line extend perpendicular to each other, and
   wherein the post-synaptic line extends in parallel with one of the pre-synaptic line and the selecting line.

2. A synapse system of a neuromorphic device, the synapse system comprising:
   a plurality of pre-synaptic neurons;
   a plurality of pre-synaptic lines respectively extending from the pre-synaptic neurons in a first direction;
   a post-synaptic neuron;
   a post-synaptic line extending from the post-synaptic neuron in a second direction;
   a plurality of synapses disposed in intersection regions between the plurality of pre-synaptic lines and the post-synaptic line to be electrically connected with the plurality of pre-synaptic lines and the post-synaptic line;
   a common resistor on the post-synaptic line between the plurality of synapses and the post-synaptic neuron, the common resistor having fixed resistance;
   a plurality of selecting controllers; and
   a plurality of selecting lines respectively extending from the plurality of selecting controllers in a third direction,
   wherein the plurality of synapses are commonly connected to the common resistor through the post-synaptic line,
   wherein each of the plurality of synapses comprises a ferroelectric transistor,
   wherein each of the plurality of selecting lines is electrically connected with a gate electrode of a ferroelectric transistor of a corresponding synapse, and
   wherein the plurality of pre-synaptic lines and the plurality of selecting lines extend perpendicular to each other.

3. The synapse system of claim 2, wherein each of the plurality of pre-synaptic lines is electrically connected with a drain electrode of a ferroelectric transistor of a corresponding synapse.

4. The synapse system of claim 2, wherein the post-synaptic line is commonly and electrically connected with source electrodes of the ferroelectric transistors of the plurality of synapses.

5. The synapse system of claim 2, wherein the common resistor comprises a first node and a second node, the first node being commonly and electrically connected with the plurality of synapses through the post-synaptic line, the second node being electrically connected with the post-synaptic neuron.

6. The synapse system of claim 5, further comprising:
   a pass transistor electrically connected with the first node of the common resistor.

7. The synapse system of claim 6, wherein the pass transistor comprises a gate electrode electrically connected with a column selection signal node, a first source/drain node electrically connected with a reference voltage node, and a second source/drain node electrically connected with the first node of the common resistor.

8. The synapse system of claim 2, wherein each of the plurality of synapses further comprises a metal oxide semiconductor (MOS) transistor.

9. The synapse system of claim 8, wherein a gate electrode of the MOS transistor and a gate electrode of the ferroelectric transistor are commonly and electrically connected with a corresponding selecting line.

10. The synapse system of claim 9, wherein a drain electrode of the MOS transistor is electrically connected with a corresponding pre-synaptic line, a source electrode of the MOS transistor is electrically connected with a drain electrode of the ferroelectric transistor, and a source electrode of the ferroelectric transistor is directly electrically connected with the post-synaptic line.

11. The synapse system of claim 9, wherein a drain electrode of the ferroelectric transistor is electrically connected with a corresponding pre-synaptic line, a source electrode of the ferroelectric transistor is electrically connected with a drain electrode of the MOS transistor, and a source electrode of the MOS transistor is directly electrically connected with the post-synaptic line.

12. A synapse system of a neuromorphic device, the synapse system comprising:
   a pre-synaptic neuron;

a pre-synaptic line extending from the pre-synaptic neuron in a first direction;
a post-synaptic neuron;
a post-synaptic line extending from the post-synaptic neuron in a second direction;
a selecting controller;
a selecting line extending from the selecting controller in a third direction;
a synapse disposed in an intersection region of the pre-synaptic line, the post-synaptic line, and the selecting line to be electrically connected with the pre-synaptic neuron, the post-synaptic neuron, and the selecting controller, the synapse including a MOS transistor and a ferroelectric transistor; and
a resistive element on the post-synaptic line between the synapse and the post-synaptic neuron,
wherein the MOS transistor and the ferroelectric transistor are electrically connected with each other in series between the pre-synaptic line and the post-synaptic line,
wherein gate electrodes of the MOS transistor and the ferroelectric transistor are commonly and electrically connected with the selecting line, and
wherein the resistive element includes a first node electrically connected with the synapse through the post-synaptic line and a second node electrically connected with the post-synaptic neuron.

13. The synapse system of claim 12, further comprising:
a pass transistor electrically connected with the first node of the resistive element.

14. The synapse system of claim 13, wherein the pass transistor comprises a gate electrode electrically connected with a column selection signal node, a first source/drain node electrically connected with a reference voltage node, and a second source/drain node electrically connected with the first node of the resistive element.

* * * * *